United States Patent [19]

Spencer

[11] 4,367,365

[45] Jan. 4, 1983

[54] SOLAR ENERGY CONVERSION ARRANGEMENT UTILIZING PHOTOVOLTAIC MEMBERS

[75] Inventor: Robert M. Spencer, Cupertino, Calif.

[73] Assignee: Acurex Solar Corporation, Mountain View, Calif.

[21] Appl. No.: 282,915

[22] Filed: Jul. 13, 1981

[51] Int. Cl.³ ............................................ H01L 31/04
[52] U.S. Cl. .................................... 136/244; 136/293
[58] Field of Search ................................ 136/244, 293

[56] References Cited

U.S. PATENT DOCUMENTS

| 3,437,818 | 4/1969 | Shattuck | 250/212 |
| 3,672,999 | 6/1972 | Barbera | 136/245 |
| 3,912,539 | 10/1975 | Magee | 136/244 |
| 3,925,103 | 12/1975 | Russell | 136/244 X |
| 3,952,324 | 4/1976 | Wolfe | 357/19 |
| 4,257,821 | 3/1981 | Kelly et al. | 136/244 |
| 4,323,719 | 4/1982 | Green | 136/249 |

FOREIGN PATENT DOCUMENTS 680977 of 1965 Italy .................................... 136/244

OTHER PUBLICATIONS

M. A. Green et al., "Silicon Solar Cells With Integral Bypass Diodes," *Solar Cells,* vol. 3, pp. 233-244 (May, 1981).

*Primary Examiner*—Aaron Weisstuch
*Attorney, Agent, or Firm*—Flehr, Hohbach, Test, Albritton & Herbert

[57] ABSTRACT

An arrangement for converting solar energy directly to electrical energy is disclosed herein and utilizes a group of photovoltaic-like panel members, each of which is designed to convert solar energy into electrical energy by developing a voltage across opposite terminals thereof in response to and dependent upon its collection of solar energy. These panel members are electrically interconnected together in a specific way which combines their voltages in order to drive a given load. In addition, individual bypass circuitry is electrically connected with each photovoltaic-like member for diverting current around the latter in the event the resistance between its terminals increases above a certain level, for example due to an open circuit or undesirable shadowing. In this way, a malfunction of one photovoltaic-like member will not disrupt the operation of the overall arrangement. In order to locate these malfunctioning members, the circuitry associated with each includes means for indicating (preferably visually) when its bypass circuitry is operating in a bypass mode.

6 Claims, 4 Drawing Figures

U.S. Patent  Jan. 4, 1983  4,367,365
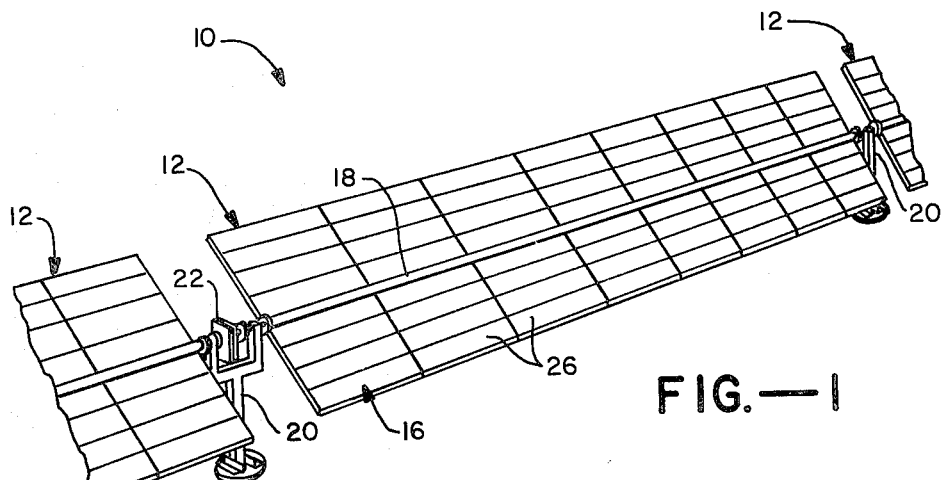
FIG.—1
FIG.—2
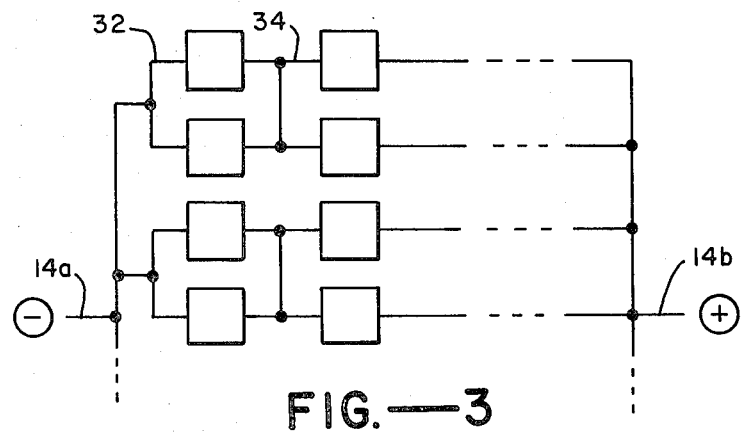
FIG.—3
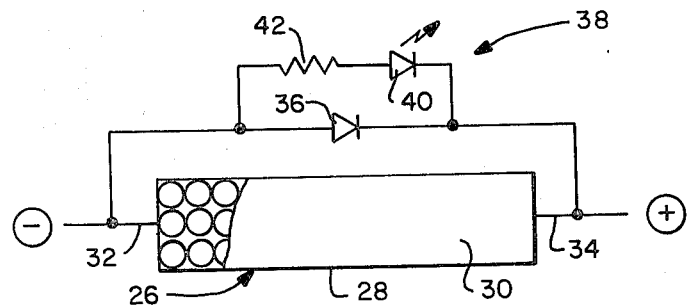
FIG.—4

SOLAR ENERGY CONVERSION ARRANGEMENT UTILIZING PHOTOVOLTAIC MEMBERS

The present invention relates generally to a solar energy conversion arrangement of the type which utilizes a large number of electrically interconnected photovoltaic or like type members, that is, members designed to convert solar energy directly into electrical energy, and more particularly to a technique for locating photovoltaic or like type members which malfunction in certain ways.

The utilization of a photovoltaic panel as part of an overall system for converting solar energy directly to electrical energy is well known in the art. One such system is described in the Department of Energy (DOE) Publication DOE/ET/No. 23053-1 having a publication date of May 1979 and entitled SOLAR PHOTOVOLTAIC FLAT PANEL APPLICATIONS EXPERIMENT. Typically, each of the particular panels utilized in a system of this type is comprised of a relatively large number of individual photovoltaic modules. Each of these modules includes its own input and output terminals and light sensitive surface and each is designed to convert solar energy directly into electrical energy by developing a voltage across its terminals in response to and dependent upon the amount of light which is collected at its light sensitive surface. An example of such a module is one manufactured by the Solar Energy Division of Motorola Company under the component designation MSP01-D30, as recited in the DOE publication referred to above.

The numerous photovoltaic modules making up each overall panel are electrically interconnected together in a specific way which combines their voltages in order to drive a given load. However, in order to do this so that the resultant voltages are additive or at least partially additive, some or all of the modules are interconnected electrically with one another in a series array. Thus, should any given series connected module develop an open circuit or an undesirably high internal resistance, the entire series connected circuit will be adversely affected. In order to overcome this problem, a bypass circuit may be provided across the terminals of each module for diverting current around the latter in the event of an open circuit or an undesirably high internal resistance. While this effectively eliminates the defective or otherwise improperly functioning module from its series connected array, it does not otherwise effect the operation of the entire array.

In view of the foregoing, it should be quite apparent that the overall conversion efficiency of a panel of the type recited above will depend, in part, on the number of individual modules which do and do not contribute to its combined voltage. Moreover, it is a relatively simple task to monitor this efficiency by monitoring its output voltage. However, because of the relatively large number of modules making up any given panel member, it has heretofore been time consuming and therefore costly to locate the defective or improperly operating modules. As a result, more often than not, these latter modules have been tolerated in the past, at least until it became obvious that the entire panel should be replaced.

In view of the foregoing, it is a primary object of the present invention to overcome the foregoing problems by providing an uncomplicated, reliable and yet economical technique for locating individual photovoltaic modules which operate improperly, that is, which develop an open circuit or, in any event, an undesirably high internal resistance.

A more specific object of the present invention is to provide a technique which visually indicates which of the above-mentioned modules, if any, operate in the improper manner just recited.

As will be seen hereinafter, the solar energy conversion arrangement disclosed herein utilizes a group of photovoltaic modules of the type recited or like members, each of which is designed to convert solar energy directly into electrical energy by developing a voltage across opposite terminals thereof in response to and dependent upon the amount of solar energy it collects. These photovoltaic or like type members are electrically interconnected together in a specific way which combines their voltages in order to drive a given load. Moreover, in accordance with the present invention, each photovoltaic or like type member includes individual means for providing a visual signal in the event that the electrical resistance of the member between its terminals increases above a certain level. In an actual working embodiment, each photovoltaic or like type member includes current diverting bypass circuitry of the type recited above and circuitry including a light emitting diode or similar device for indicating when its associated bypass circuitry is operating in a current diverting mode which, in turn, signifies an improperly operating module.

The overall solar energy conversion arrangement disclosed herein will be described in more detail hereinafter in conjunction with the drawing wherein:

FIG. 1 is a perspective view of part of an overall solar energy conversion system which includes a number of photovoltaic or like type members and which is designed in accordance with the present invention;

FIG. 2 diagrammatically illustrates how the various panel members comprising part of the overall system of FIG. 1 are electrically connected to one another;

FIG. 3 diagrammatically illustrates the electrical interconnection between a plurality of individual photovoltaic or like type modules which comprise part of a single one of the overall panel members illustrated in FIGS. 1 and 2; and FIG. 4 diagrammatically illustrates any one of the modules shown in FIG. 3 and associated circuitry designed in accordance with the present invention for providing a signal, preferably a visual signal, in the event that the internal electrical resistance of the module increases above a certain level and, in any event, if the module develops an open circuit.

Turning now to the drawing, attention is first directed to FIG. 1 which, as stated above, illustrates a solar energy conversion system designed in accordance with the present invention. This system is generally indicated by the reference numeral 10 and includes a plurality of solar photovoltaic flat panels 12 which are electrically interconnected to one another in series, as indicated in FIG. 2. Each panel includes opposite input and output terminals 14a and 14b (see FIG. 3) and an overall solar collecting front side 16 (see FIG. 1) which is adapted to collect solar energy. All of the solar energy collected by the various series connected panels are converted by the latter to corresponding voltages which are additive across the overall array between input and output terminals 14a and 14b.

As stated above, overall system 10 includes a plurality of panels 12, only three of which are illustrated in FIG. 1. However, in an actual working embodiment, the entire system is comprised of eight or more panels. These panels may be supported in fixed positions relative to the sun regardless of the position of the latter or they may be supported for movement in tracking relationship with the sun. In the particular system illustrated, the panels are supported in a solar tracking mode by any suitable support arrangement, which arrangement does not form part of the present invention. It should suffice to say that the particular support arrangement shown includes a number of horizontally extending, co-linear torque tubes 18 which are supported for rotation about their respective co-linear axes by a number of support posts 20. One or more drive assemblies, one of which is generally indicated at 22, may be utilized in conjunction with one or more support posts for rotating the panels 12 simultaneously with one another.

As illustrated in FIG. 1, each of the overall panel members 12 is comprised of a relatively large number of subpanels, actually photovoltaic modules which may be of the type recited previously or of any other type. In the embodiment illustrated, each of the overall panels 12 includes sixty-four modules which are generally indicated at 26. One of these modules is illustrated in greater detail in FIG. 4. As seen there, the module includes a main body 28 having a light sensitive front face 30 and opposite terminals, a negative terminal 32 and a positive terminal 34. In the particular embodiment illustrated, all of the modules 26 making up a given panel 12 are electrically interconnected in the manner illustrated in FIG. 3 and are physically positioned relative to one another such that their combined surfaces 30 make up previously recited overall surface 16.

Each of the modules 26 includes a bypass diode 36 or like device for causing current which would otherwise pass through module body 28 to be diverted around the module body in the event that the internal resistance of the latter rises above some predesigned level and particularly if the module body develops an open circuit. One such device to accomplish this is a diode connected between terminals 32 and 34 in a reverse bias fashion, as illustrated in FIG. 4. This diode or like device provides the advantages discussed previously.

In accordance with the present invention, each photovoltaic module or like member includes means generally designated by the reference numeral 38 for indicating if and when the associated module or like member develops an open circuit or otherwise displays an internal resistance above the predesigned level. The particular means 38 to accomplish this includes a light emitting diode (LED) 40 and series connected current limiting resistor 42 which are connected across the diode 36. By selecting a relatively large value for resistor 42, for example on the order of 220 ohms, should the bypass diode operate in its current diverting mode, a small part of this current can be used to drive the LED and thereby indicate that the bypass diode is in fact operating in its current diverting mode. This, in turn, indicates that the resistance of the associated module 26 between its terminals 32, 34 has reached and/or exceeded the predesigned, threshold level.

The light emitting diodes 40 described above can be physically located on a control panel or they can be disposed behind their respective modules. In either case, it should be apparent that one could make a rapid and relatively easy visual inspection of any given panel and locate any module or modules not contributing to the overall panel in accordance with its intended design because of an open circuit or undesirably high internal resistance. As a result, these particular modules can be readily replaced when the malfunction occurs without a great deal of effort and therefore at a minimal cost. In fact, the panels themselves can be designed to include plug-in modules which could be replaced quite rapidly and at a cost not much greater than the cost of the module itself.

What is claimed is:

1. A solar energy conversion arrangement comprising a group of photovoltaic or like type members, each of which is designed to convert solar energy directly into electrical energy by developing a voltage across opposite terminals thereof in response to and dependent on the amount of solar energy it collects, means for electrically interconnecting said members together in a specific way which combines their voltages in order to drive a given load, and individual means associated with each photovoltaic or like type member for producing a visual signal in the event that the electrical resistance of the latter between its terminal means increases above a certain level.

2. An arrangement according to claim 1 wherein each of said individual means includes a light emitting diode connected across the opposite terminal means of its associated photovoltaic or like type member.

3. An arrangement according to claim 2 wherein each of said individual means includes a load resistor connected in series with its light emitting diode.

4. An arrangement according to claim 3 including current bypass circuit means connected across the opposite terminal means of each photovoltaic or like type member for diverting current around the latter in the event the resistance between its terminal means increases above said certain level.

5. A solar energy conversion arrangement comprising a group of photovoltaic or like type members, each of which is designed to convert solar energy directly into electrical energy by developing a voltage across opposite terminals thereof in response to and dependent on the amount of solar energy it collects, means for electrically interconnecting said members together in a specific way which combines their voltages in order to drive a given load, individual means electrically connected in parallel with each photovoltaic or like type member for diverting current around the latter in the event the resistance between its terminal means increases above a certain level, and means including electrically connected in parallel with said diverting means for indicating if and when said diverting means operates to divert said current.

6. An arrangement according to claim 5 wherein said indicating means includes a light emitting diode type of device.

* * * * *